United States Patent [19]

Ranger

[11] Patent Number: 4,818,950
[45] Date of Patent: Apr. 4, 1989

[54] LOW JITTER PHASE-LOCKED LOOP
[75] Inventor: Michael H. Ranger, San Jose, Calif.
[73] Assignee: NCR Corporation, Dayton, Ohio
[21] Appl. No.: 41,907
[22] Filed: Apr. 24, 1987
[51] Int. Cl.[4] .............................................. H03K 5/13
[52] U.S. Cl. ..................................... 328/155; 331/17; 307/511
[58] Field of Search ........................... 331/1 A, 17, 25; 328/155; 307/511, 510, 521, 526

[56] References Cited

U.S. PATENT DOCUMENTS

| | | | |
|---|---|---|---|
| 3,781,695 | 12/1973 | Jackson | 328/155 |
| 4,017,806 | 4/1977 | Rogers | 331/1 A |
| 4,107,624 | 8/1978 | Turner | 331/8 |
| 4,122,404 | 10/1978 | Fuhrman | 328/133 X |
| 4,162,450 | 7/1979 | Buhrer | 331/1 A X |
| 4,166,984 | 9/1979 | Jenkins | 331/25 X |
| 4,280,099 | 7/1981 | Rattlingourd | 328/155 X |
| 4,321,483 | 3/1982 | Dugan | 307/511 X |
| 4,379,270 | 4/1983 | Carter et al. | 331/17 X |
| 4,387,348 | 6/1983 | Fritze | 331/17 |
| 4,479,091 | 10/1984 | Yoshisato | 331/17 X |
| 4,506,233 | 3/1985 | Englund, Jr. | 331/17 |
| 4,534,044 | 8/1985 | Funke et al. | 331/1 A X |
| 4,543,540 | 9/1985 | Linder | 331/1 A |
| 4,546,330 | 10/1985 | Okada | 331/1 A X |
| 4,562,410 | 12/1985 | O'Rourke | 331/1 A |
| 4,563,657 | 1/1986 | Qureshi et al. | 331/14 X |
| 4,635,000 | 1/1987 | Swanberg | 331/10 |
| 4,649,353 | 3/1987 | Sonnenberg | 331/25 X |
| 4,667,170 | 5/1987 | Lofgren et al. | 331/17 |
| 4,737,722 | 4/1988 | Ramesh et al. | 328/155 X |
| 4,752,749 | 6/1988 | Moger | 331/17 |

FOREIGN PATENT DOCUMENTS 0164785  12/1973  European Pat. Off. .

Primary Examiner—Eugene R. LaRoche
Assistant Examiner—Seung Ham
Attorney, Agent, or Firm—Wilbert Hawk, Jr.; Edward Dugas

[57] ABSTRACT

In the preferred embodiment of the invention the jitter in the output signal of a phase-lock loop is minimized by driving a voltage controlled oscillator (VCO) with the average voltage level that appears across a capacitor. The voltage level is maintained by selectively pumping a charge into the capacitor as a function of the deviation of the output signal, from the VCO, from a desired output in a first direction. The charge on the capacitor is allowed to partially bleed off to ground through a variable resistance such that the charge on the capacitor is maintained at levels that cause a slight phase lag in the operation of the voltage controlled oscillator. The phase-locked loop more specifically utilizes an error detector for receiving an incoming digital signal to which the phase-locked loop is to lock and a reference signal corresponding to a divided output signal from the phase-locked loop. The error detector provides signals indicative of the magnitude and the direction of the difference between the incoming digital signal and the reference signal. The difference signals are coupled to a pulse driver circuit for providing pulse charges as a function of the difference signals. A low pass filter having a capacitor receives the pulse charges for charging the capacitor. The low pass filter also incldues means for controllably discharging the capacitor. A voltage controlled oscillator provides an output signal having a phase that is a function of the magnitude of the charge on the capacitor. A divider circuit divides the output signal by selected integers to provide to the error detector the reference signal.

10 Claims, 8 Drawing Sheets

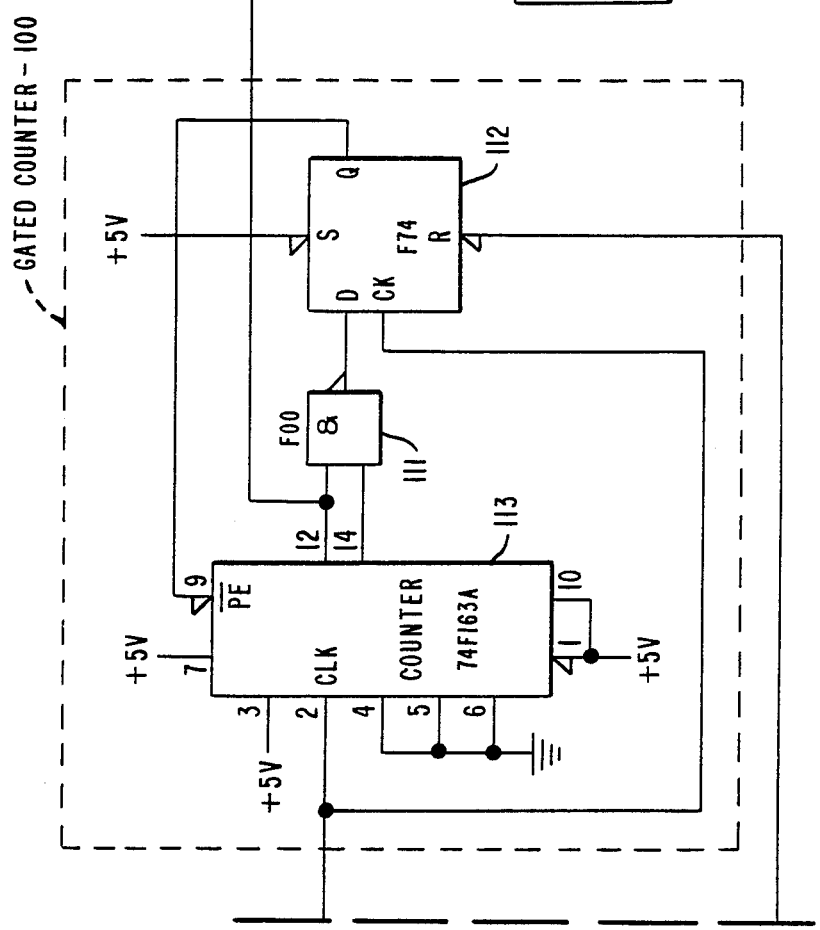
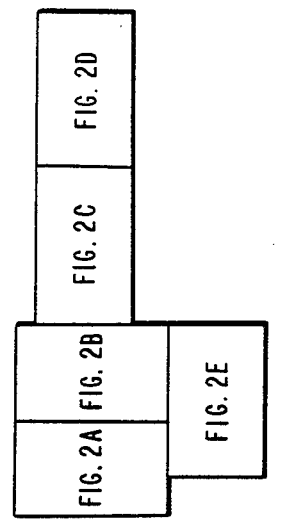
FIG. 2D
FIG. 2

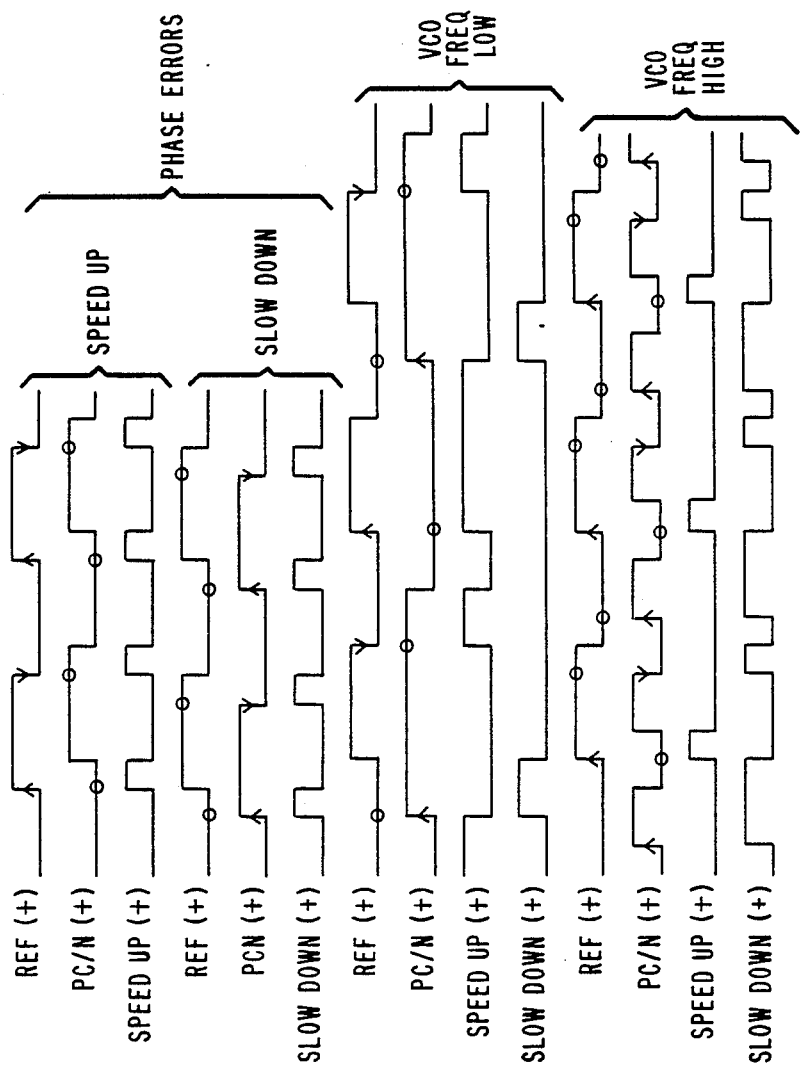

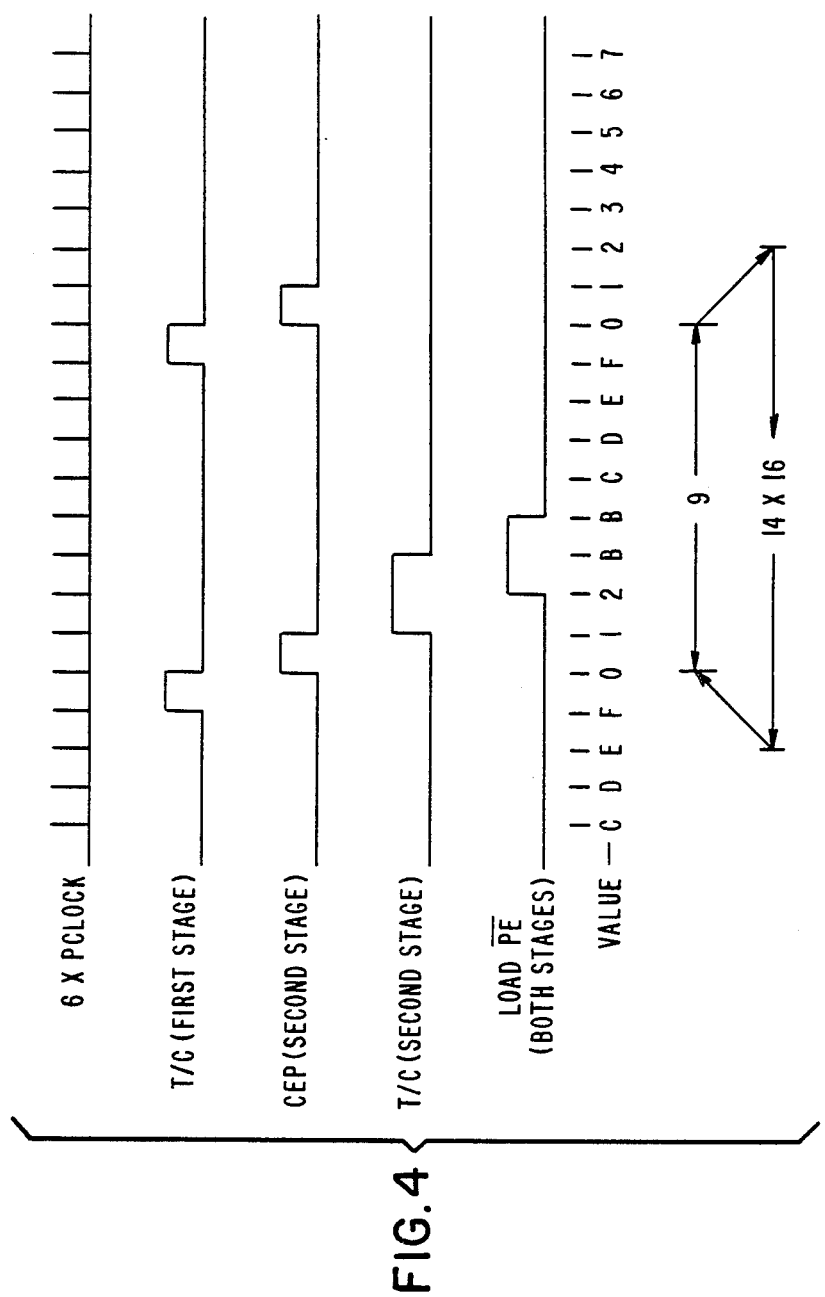

LOW JITTER PHASE-LOCKED LOOP

BACKGROUND OF THE INVENTION

This invention relates to digital phase-locked loops for synchronizing a local clock signal to a received digital signal with minimum jitter.

In general, phase-locked loops include an error (phase) detector for receiving an incoming digital signal, a low pass filter, a voltage controlled oscillator, and a feedback circuit, such as a divider circuit, for directing the output signal from the voltage controlled oscillator back to an input to the error detector as a reference signal for a comparison against the incoming digital signal. If the phase relationship between the digital signal and the reference signal changes, the error detector provides an error signal indicative of the direction and the magnitude of the change. The output of the voltage controlled oscillator is then adjusted in response to a filtered version of the error signal to drive the error signal to zero to lock the reference signal derived from the voltage controlled oscillator to the incoming digital signal.

One patent of particular interest is U.S. Pat. No. 3,781,695 entitled, "Digital Phase-Locked-Loop, by E. J. Jackson. The circuit of that patent uses an up-down counter to produce a resultant count signal that is proportioned to the lead or the lag of the phase difference between a reference signal and the incoming signal. The resultant count signal is used to adjust the reference signal so as to lock the reference signal to the incoming signal.

The deviation of the reference signal, in most phase-lock loop systems, can be either positive (high) or negative (low) with respect to the incoming signal. Two sets of circuits are used to provide the needed correction. One circuit processes deviations which are positive and the other circuit processes deviations which are negative. Although each set of circuits may contain identical circuit components, there are enough differences in the electrical characteristics of the components that identical signals applied to each correction circuit will produce a different output. When such a system is used in an environment requiring minimum jitter, in the output signal, the requirement is not met because the reference signal is continually driven positive and negative in an uneven manner around the desired null position. This continual hunting around the null position is called jitter.

The present invention is directed to a system for minimizing that jitter.

SUMMARY OF THE INVENTION

In the present invention minimum jitter is achieved by using lagging corrections which come from one circuit. In other words, the corrections come from the positive direction only. In addition, the error or deviation is averaged over several cycles so as to discriminate against "bit jitter" or noise. Bit jitter is the instability associated with individual bits in both the incoming signal and in the reference signal which is manifested in the time of occurrence of the leading and the trailing edges of the pulses forming a pulse train such that the edges are not equally spaced and instead occur either slightly premature or slightly late. Sequentially causing the phase-locked loop to lock to e.g. the loading edge of each pulse as it is received will cause the output of the phase-locked loop to jitter at the combined rate of the input pulses and its own internal jitter rate.

The present invention by its averaging operation minimizes the effect of "bit jitter" and noise.

In a preferred embodiment of the invention there is provided an error detector for receiving an incoming digital signal (first phase signal) and a reference signal (second phase signal) and for providing a SPEED UP signal or a SLOW DOWN signal indicative of the difference in the phase between the first phase signal and the second phase signal. A pulse driver circuit provides power pulses as a function of the pulse width of the SPEED UP signal. A low pass filter is coupled to the output of the pulse driver circuit for receiving the power pulses. The filter includes a capacitor and a variable resistor which is connected across the capacitor for controlling its discharge. A voltage controlled oscillator is responsive to the voltage stored in the capacitor so as to provide an output signal as a function of the charge. A divider circuit receives the output signal from the voltage controlled oscillator and divides it down to form the reference signal that is directed to the error detector.

From the foregoing, it can be seen that it is a primary object of the present invention to provide a phase-locked loop having minimum jitter.

It is another object of the present invention to provide a phase-locked loop that is operated in a phase lag mode.

It is a further object of the present invention to provide a digital phase-locked loop wherein adjustment of the output is averaged over a number of cycles of the input signal.

These and other objects of the present invention will become more apparent when taken in conjunction with the following description and drawings, wherein like characters indicate like parts and which drawings form a part of the present specification.

BRIEF DESCRIPTION OF THE DRAWINGS

FIGS. 2A-2E, assembled in accordance with the map of FIG. 2, illustrate in schematic form the preferred embodiment of the invention.

FIG. 3 illustrates a first group of waveforms useful in understanding the operation of the preferred embodiment of the invention.

FIG. 4 illustrates a second group of waveforms useful in understanding the operation of the preferred embodiment of the invention.

DESCRIPTION OF THE PREFERRED EMBODIMENT

Figure 1:
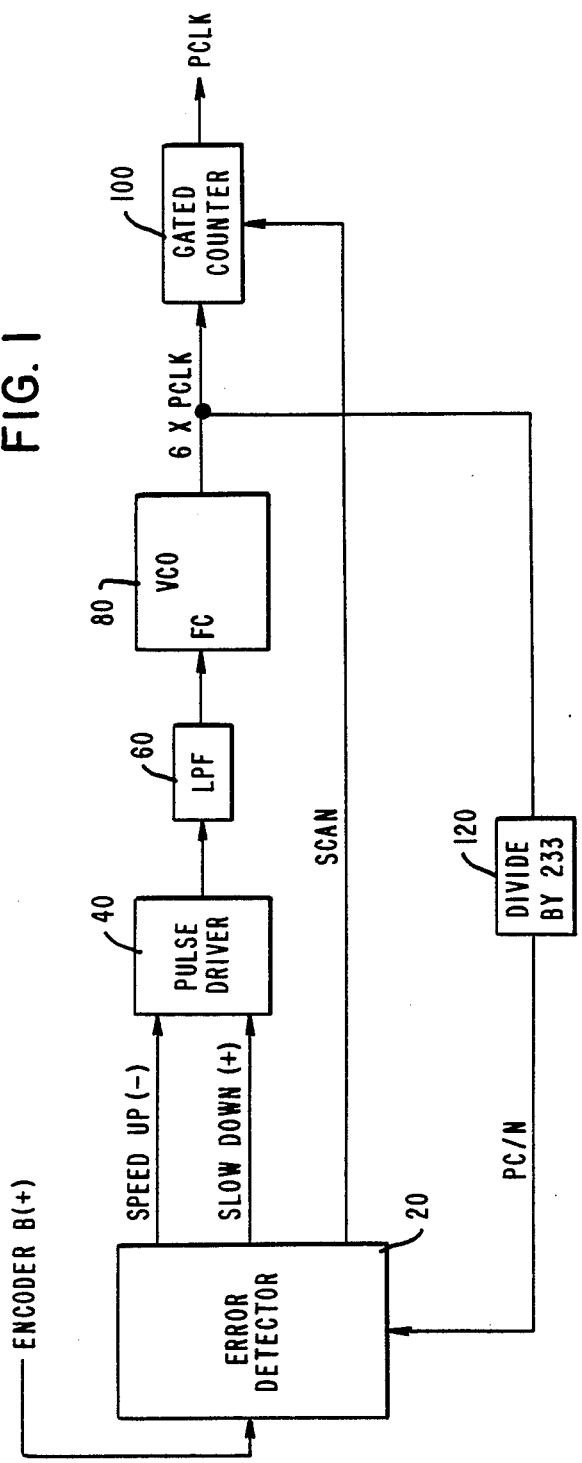
FIG. 1 illustrates, in block diagram form, the preferred embodiment of the invention.

Referring to FIG. 1, an error detector 20 receives as an incoming digital signal an ENCODER B(+) signal which signal is a pulse signal having a pulse repetition rate corresponding to the passage of an encoder disk past a reference point wherein the encoder disk is driven by a motor. Also provided as an input to the error detector 20 is a reference (PC/N) signal which is derived from the output labeled 6XPCLK of a voltage controlled oscillator, VCO 80 which output is divided by the quantity 233 in a divide by 233 circuit 120 to provide the PC/N signal. Two output signals are provided by the error detector 20; one is a SPEED UP(−) and the other is a SLOW DOWN(+) signal. These two signals are directed to the inputs of a pulse driver circuit 40 the output of which is a charging signal having an energy content which is a function of the signals received at its inputs. A low pass filter 60 filters high frequency signal components from the charging signal and provides for the overall system gain. In addition, the low pass filter contains a charging capacitor for storing the energy received from the pulse driver and a means for discharging the stored energy as a function of a resistance path to ground. The charge level on the capacitor is directed to the output of the low pass filter 60 and to the input labeled FC of the VCO 80. The output signal from the VCO 80 is a signal that is 6XPCLK.

In operation of the system thus far described, the output signal from the VCO is adjusted in frequency in response to the level of the signal appearing on the input labeled FC. The level of the signal appearing on the FC is a function of the difference, high or low, of the PC/N signal from the incoming signal ENCODER B(+). The signal 6XPCLK is directed to the input of the divide by 233 circuit 120, which circuit provides at its output the PC/N signal. A gated counter circuit 100 receives as its input the signal 6XPCLK and provides a dividing function which divides the incoming signal by 6, so as to provide the output signal PCLK, when the scan line from the error detector to the gated counter 100 carries a high enabling SCAN signal. When the enabling signal on the scan line is not high, the output of the gated counter 100 remains at a logical low level. The scan signal finds particular utility when the PCLK signal is used to gate pixel data from a modulated laser beam onto a recording medium.

Referring now to FIGS. 2A–2E, assembled in accordance with the map of FIG. 2, the input signal denoted ENCODER B(+) is directed to the clocking inputs CLK of a D-type flip-flop 21 and a D-type flip-flop 29. The D input to flip-flop 29 is the SCAN ENABLED INDEX PULSE(−) signal which occurs at the beginning of each active scanning line of a laser beam as it moves across a recording medium to record data. The present invention finds particular utility in such a system. The output from the flip-flop 29, taken from the non complemented output labeled Q, is directed to an input of a positive AND gate 34. The other input to the AND gate 34 is connected to receive a signal, SCAN(+) and upon the concurrence of the signals on its inputs being logically high, the signal SCAN on the output of AND gate 34 will be high, thus enabling the gated counter 100.

The output signal from the complemented output labeled Q/ of the D-type flip-flop 21, is directed to an input of a positive AND gate 25 and to the S, D, and CLK inputs of D-type flip-flops 24, 28 and 26, respectively. The non complemented output labeled Q from flip-flop 21 is directed to the D input of a D-type flip-flop 24, the CLK input to a D-type flip-flop 23, to the S input of a D-type flip-flop 28 and to an input to an AND gate 27. The AND gate 25 receives as its other input the signal labeled INDEX PULSE(−). When the AND gate 25 is enabled, it provides a high level logic signal to the D-labeled input of the flip-flop 21 wherein the high level signal is transferred to the Q output upon the occurrence of a positive going transaction in the clock signal CLK. The flip-flop 22 receives on its CLK input the PC/N signal from the divide by 233 circuit 120. Upon the positive going transition of the signal appearing on the CLK input of flip-flop 22, the signal appearing at the complementary output labeled Q/ appears at the D-labeled input of flip-flop 22 and its complement appears at the Q-labeled output. The output signal at the Q output of flip-flop 22 is directed to the D-labeled input of the D-type flip-flop 23, the S-labeled input of the D-type flip-flop 26 and to the CLK input of flip-flop 24. The signal at the Q/ output is also directed to the S-labeled input of flip-flop 23, the D-labeled input of flip-flop 26 and the CLK input of flip-flop 28. The signal on the line connected to the Q/labeled output of the flip-flop 22 is denoted as being PC/N(−). The signal on the Q-labeled output is denoted PC/N(+).

The signal on the line from the Q-labeled output of flip-flop 21 is denoted REF(+) and the signal on the complementary output Q/ is denoted as being REF(−). When the phase-locked loop of the present invention is in a true lock condition, the signals REF(+) and PC/N(+) are approximately synchronous.

A dual 4-bit binary counter 32 which in the preferred embodiment is a 74LS393 chip is cascaded by the jumper connection between the terminals 6 and 13 and is provided with an input on terminal 1 from an AND gate 27. The counter 32 provides an output on the terminal labeled 8 to the input of an NAND gate 31. A clear signal derived from the Q/ output of flip-flop 29 is received by the counter 32 on the terminals labeled 2 and 12. The output from the NAND gate 31 is directed to an input to AND gate 27 and to an input to an AND gate 34.

The operation of the gated counter 100 is only enabled for 256 cycles of the ENCODER B(+) signal, initiated by a negative pulse on the SCAN ENABLED INDEX PULSE line. Prior to the arrival of the negative pulse, gated counter 100 will be inhibited by the 128 bit of counter 32 being high (it being evident that the 256 count is achieved with the REF(+) signal from flip-flop 21 which occurs at one-half the rate of the ENCODER B(+) signal). A high on pin 8 of counter 32 inhibits further count pulses to counter 32 via inverting gate 31, and AND gate 27, and inhibits counter 100, via inverting gate 31 and AND gate 34 giving a reset to flip-flop 112 located in the gated counter 100, and thereby a continuous load value of 1 to counter 113. As a negative pulse arrives on the SCAN ENABLED INDEX PULSE line and is clocked from it to the Q output of the flip-flop 29, counter 100 is maintained in an inhibited state via the gate 34 sending a signal to the reset input of flip-flop 112. Simultaneously, counter 32 is being reset via the Q output of flip-flop 29, to begin its 128 count of the REF(+) signal. When the SCAN ENABLED INDEX PULSE has gone high once more, the Q output of flip-flop 29 is clocked high on the next positive going ENCODE B(+) transition, and counter 100 is enabled via the output of gate 34 going high.

Referring back to the Q output from the flip-flop 26, the Q output is directed to an input to a positive AND gate 30 which AND gate also receives as an input the Q output from the flip-flop 23. The output of the AND gate 30 is the SPEED UP(−) signal.

Referring momentarily to FIG. 3 and to the group of signals entitled, "PHASE ERRORS" and more specifically to the subgroup of figures entitled, "SPEED UP", the SPEED UP signal is shown consisting of a group of pulses having a width corresponding to the lag of the REF(+) signal from the PC/N(+) signal.

A positive NAND gate 33 receives as one of its inputs the signal on the Q output of flip-flop 28 and the signal on the Q output of flip-flop 24. The output of the NAND gate 33 is the SLOW DOWN signal which again referring momentarily to FIG. 3, is shown with the signal REF(+) occurring after the signal PC/N(+) so as to generate the pulse signals denoted SLOW DOWN(+). The SPEED UP and SLOW DOWN signals are directed as inputs to the pulse driver circuit 40 which circuit is comprised of two complementary transistors, MPS4258 and MPS2369. The transistors are connected to a +5 V source and to a ground, in series circuit with two 100 ohm resistors that connect the collectors of the transistors together. The base of transistor MPS2369 is connected to the +5 V source by a 1.5 K resistor and the base of transistor MPS4258 is connected to the +5 V source by a 510 ohm resistor and to the output, SPEED UP(+), of the positive AND gate 30 by means of a second 510 ohm resistor. The SLOW DOWN signal from the output of the NAND gate 33 is connected directly to the base of transistor MPS2369. The output of the pulse driver circuit 40 is taken from the junction of the two 100 ohm resistors and is directed to the low pass filter 60. The low pass filter 60 is an integrating circuit comprised of a 10 nf capacitor which is connected to a 20 K variable resistor and to the input of the VCO 80. Connected across the 10 nf capacitor is a 500 K variable resistor. The sizing of the components of the low pass filter are selected so as to cause a lagging of the reference signal from the incoming digital signal by a time factor of 200 ns. This is achieved by the controlled discharge of the 10 nf filter capacitor through the 500 K resistor between one SPEED UP pulse and the next. In other words, the charge on the 10 nf filter capacitor will increase each time pulse driver circuit 40 responds to a SPEED UP pulse. This increased voltage is received on input FC of the 74S124 integrated circuit chip, thereby increasing the frequency of pulses from output YO of 74S124. However, in the interval between the termination of a signal from pulse driver circuit 40 and the receipt of the next signal, the 10 nf capacitor has a controlled discharge through the 500 K resistor, As the charge on the 10 nf capacitor decreases, the frequency of pulses output from pin 7 will decrease. The net result of first increasing and then decreasing the frequency of pulses output from VCO 80 is that the PC/N reference signal will continue to lag the incoming digital signal, Thus, the waveforms labeled "SPEED U" in FIG. 3 depict the normal operation of the subject circuit.

Additionally, the 500K variable resistor is used to equalize the input impedance of the VCO to a normalized design value. In production, it was found that the input impedance of the 74S124 type integrated circuit, forming the VCO 80, had a 5-1 variation in the input impedance from one chip to another. It was therefore necessary to find a means of producing these phase-lock loop circuits with a predictable operating range and the 500 K pot provided this solution. The 74S124 integrated circuit chip is provided with a 2 pf capacitor connected across the terminals labeled 4 and 5 so as to generate the desired oscillating frequency. A ranging circuit is connected to the input 3 labeled RNG which ranging circuit is comprised of a 10 nf capacitor connected in parallel with a 510 ohm resistor connected in series to a 2 K pot. The pot is then connected to the +5 V source and in operation is adjusted to provide the desired ranging for the VCO 80. A 0.1 mf capacitor is connected to ground and to the +5 V supply along with the terminals 15 and 16 to the chip 74S124 for the purpose of filtering high frequency noise. The output signal from the VCO 80 is taken from the terminal labeled $Y_0$ of the 74S124 chip and is directed to the CLK input of the D-type flip-flops 122 and 124 in the divide by 233 circuit 120 and to the counters 121 and 123 in the same circuit. In addition, the output from YO is directed to the CLK input of the counter chip 113 in the gated counter 100 and to the CK input of the flip-flop 112.

Referring momentarily again to FIG. 3 and the group of waveforms labeled VCO FREQ LOW. From that group of waveforms, it can be seen that when the VCO frequency output is low, as denoted by a comparison of the pulse width of the REF(+) signal to the pulse width of the PC/N(+) signal, both the SPEED UP and the SLOW DOWN lines get activated to provide signals but, the duty-cycle of the pulses on the SPEED UP line is much greater than that of the pulses on the SLOW DOWN lines so that the net effect will be to speed up the VCO. In the example shown, the SPEED UP duty-cycle is 50% while the SLOW DOWN duty-cycle is only 12.5%. In a similar manner, when referring to the waveforms corresponding to the VCO FREQ HIGH, the SPEED UP duty-cycle is only 12.5% while the SLOW DOWN duty-cycle is 50%. However, both the VCO FREQ LOW waveforms and the VCO FREQ HIGH waveforms depict a condition that only occurs typically during start-up and transient conditions. Under normal operating conditions the frequency differences between the PC/N and the incoming digital signal are quickly stabilized and the phase-locked loop operates to control the phase between the signals.

Referring back to the divide by 233 circuit 120, the first counter 123, has it inputs 3, 4, 5, and 6 strapped to a hexidecimal B(11) value. The terminal count signal T/C from the counter 123 is directed to the D input of the flip-flop 124 which flip-flop operates to reclock the terminal count signal as a function of the 6XPCLK signal appearing on its CLK input. In so doing, the flip-flop 124 provides a one count delay in the signal appearing at its Q output. That signal is directed to the enabling input CEP of the second counter 121. Counter 121 is strapped to a 0 hex value by connecting the terminals labeled 3, 4, 5 and 6 to ground. The strapped hex values of counters 121 and 123 are preloaded into the counters when the signal CEP is high and PE/ is low. Counters 121 and 123 receive on their CLK inputs the 6XPCLK signal. The T/C signal from the counter 121 is directed to the D-labeled input of flip-flop 122 which flip-flop is also clocked by the 6XPCLK signal. The Q output of flip-flop 122 is the PC/N signal. The signal on the Q/ output of flip-flop 122 is directed to the PE/ inputs of the counters 121 and 123.

Figure 2A:
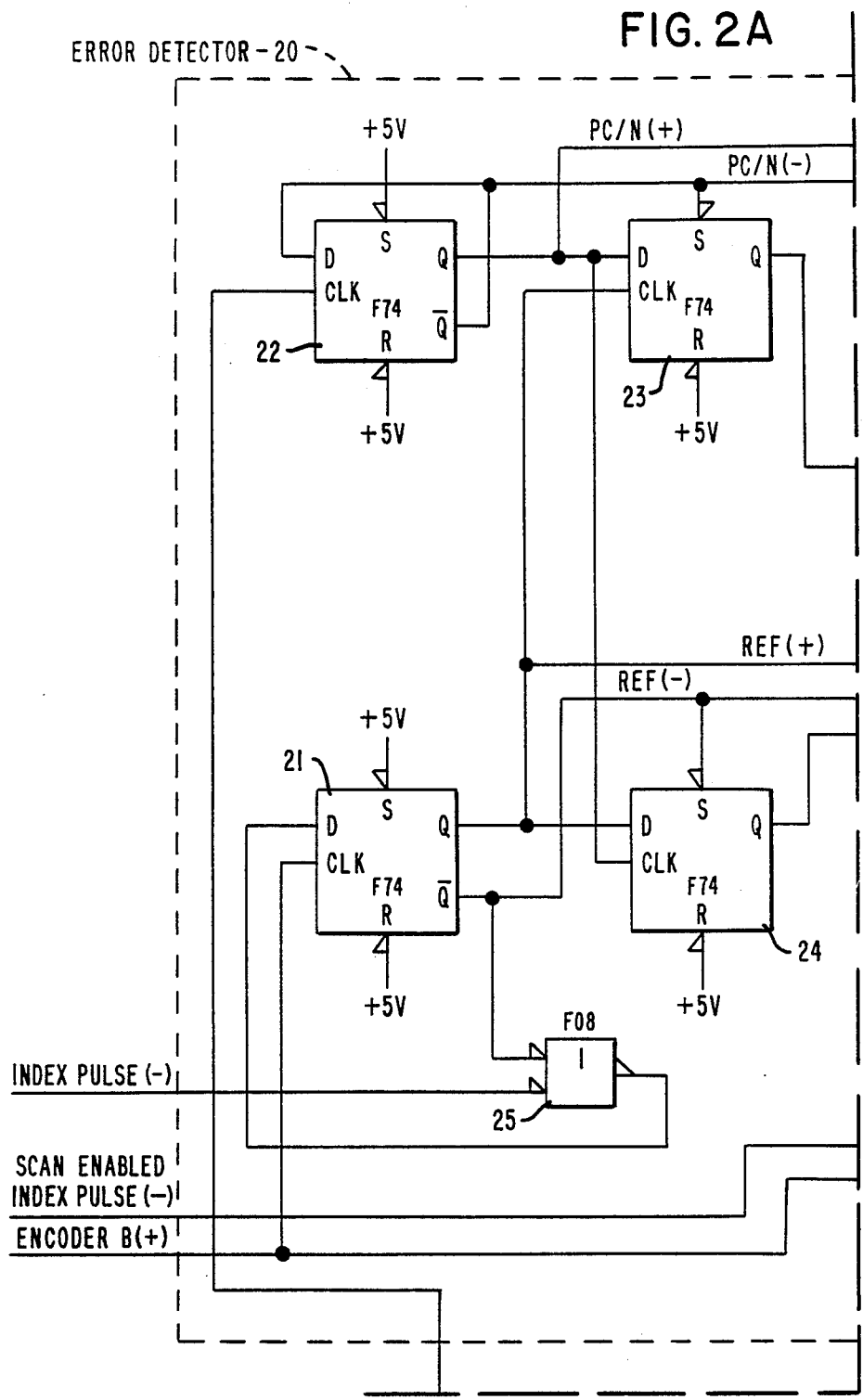
Figure 2B:
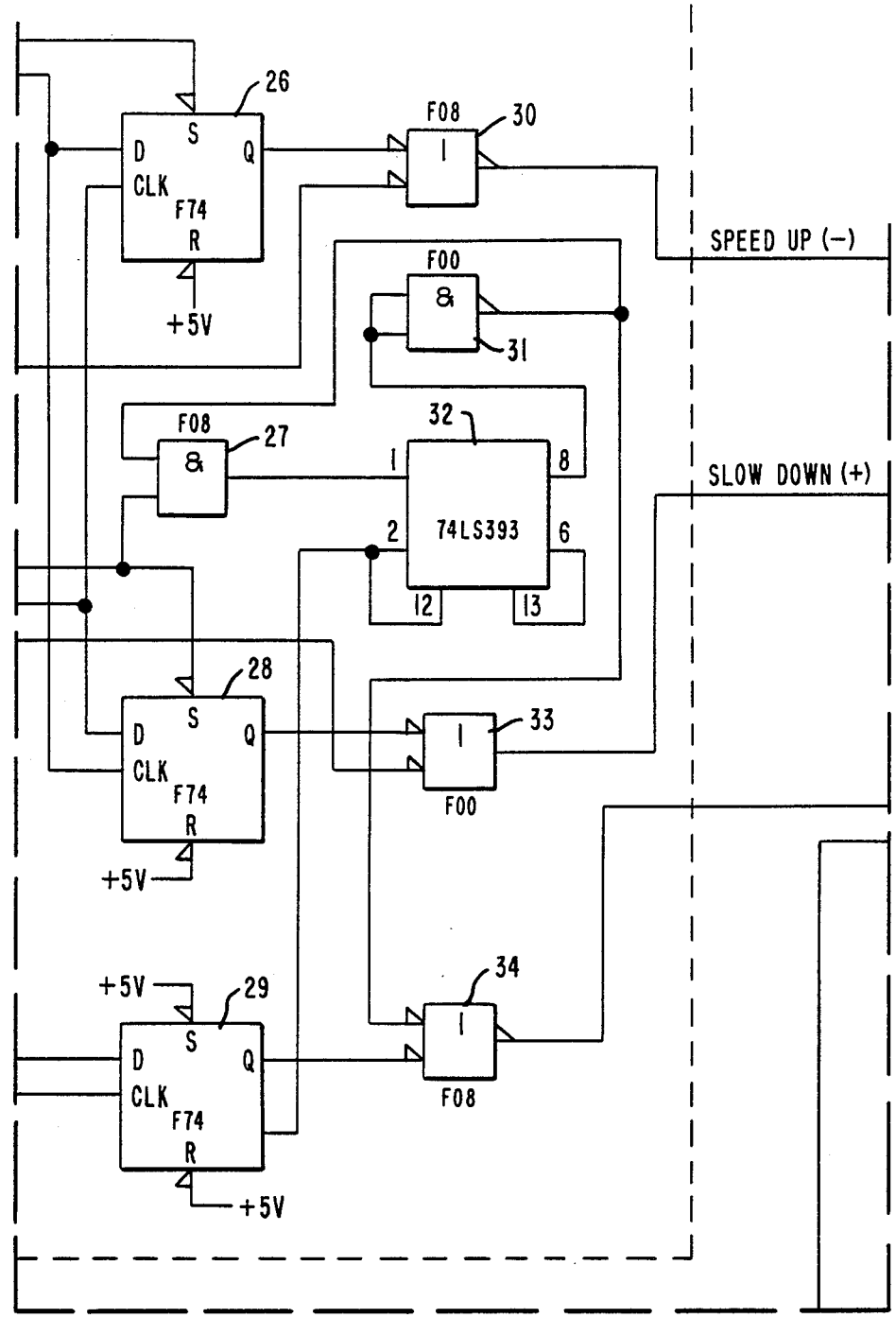
Figure 2C:
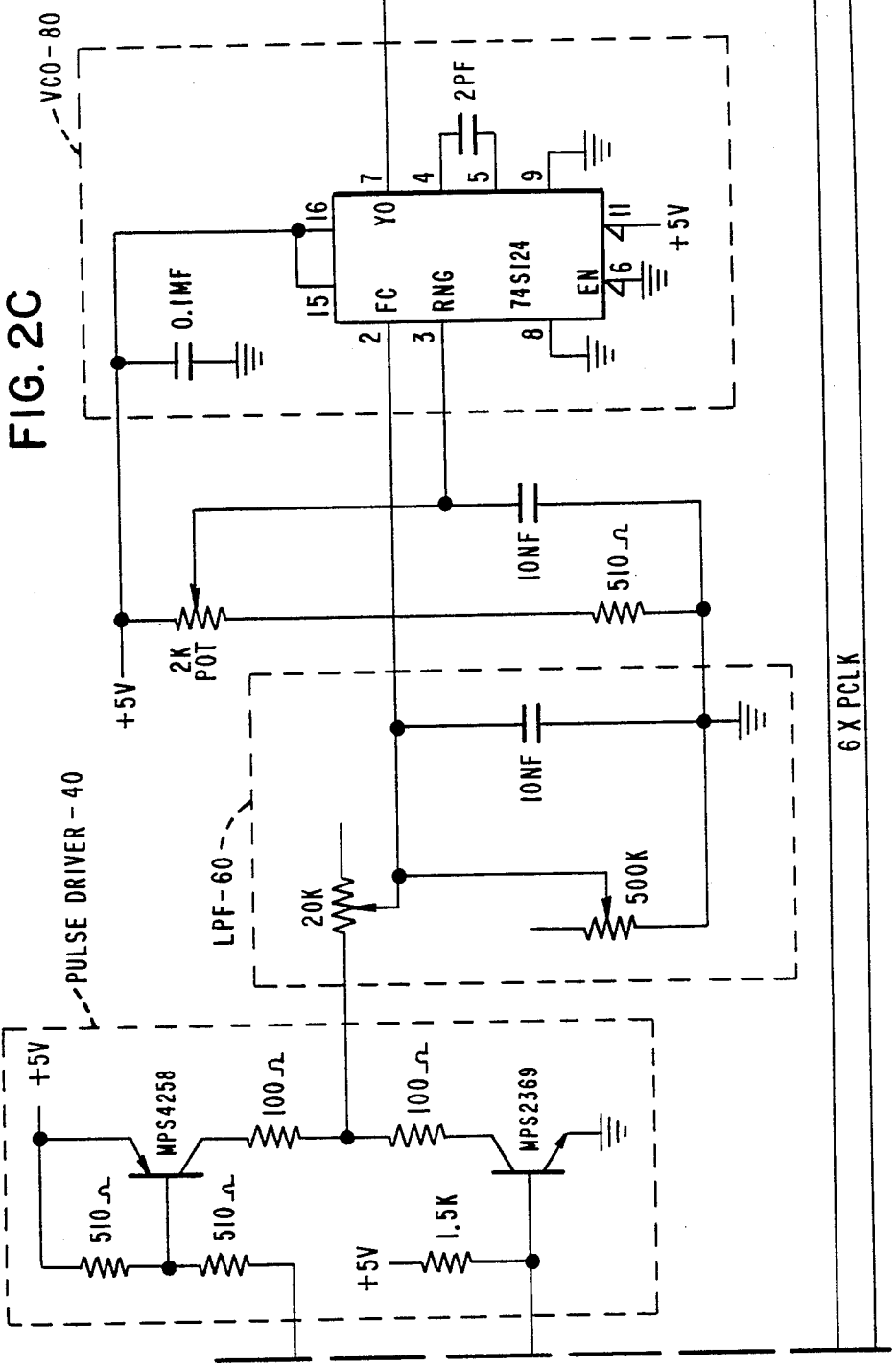
Figure 2E:
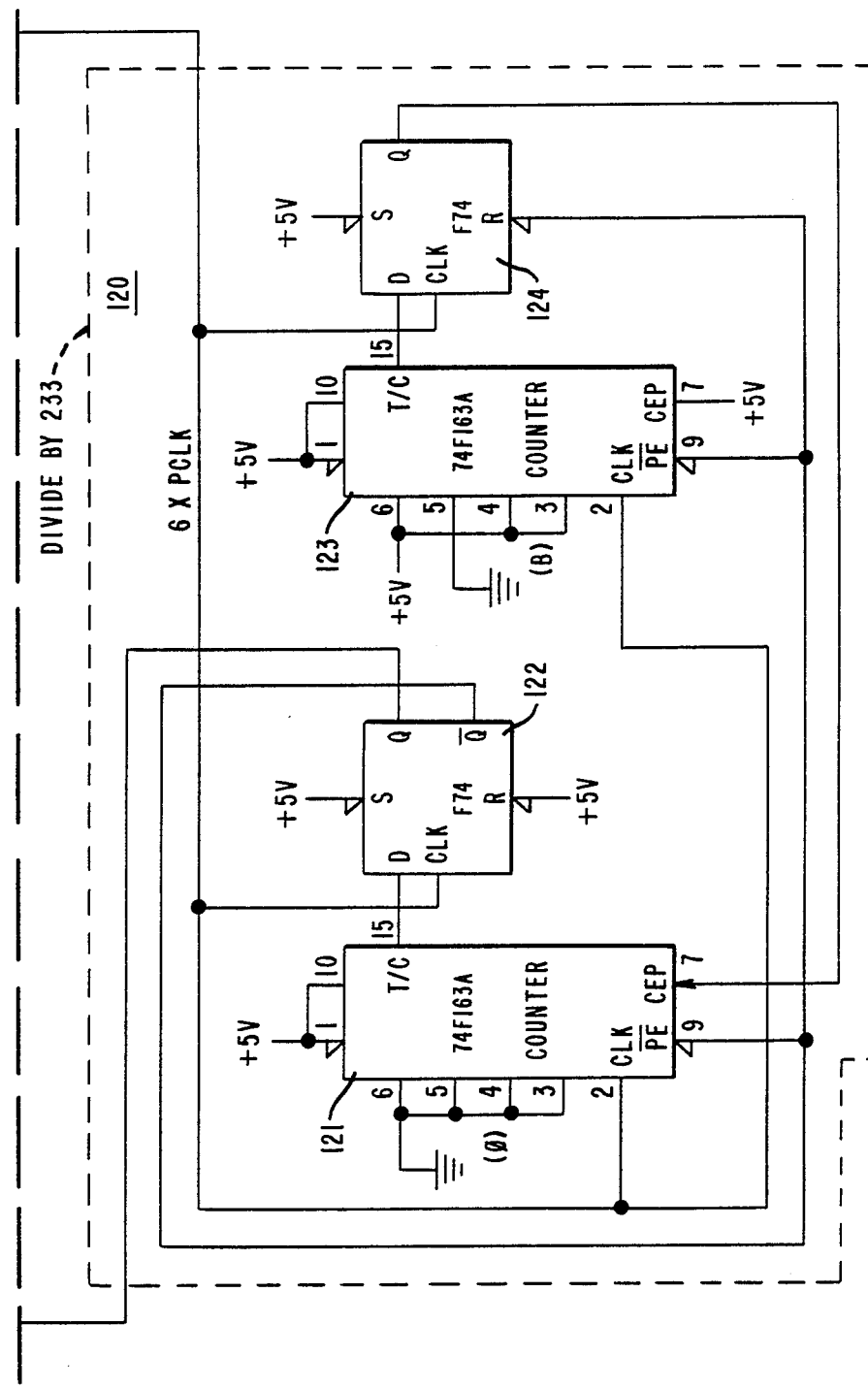

Referring now to FIG. 4, in conjunction with the divide by 233 circuit 120 in FIG. 2E, the 6XPCLK pulses, as previously described, clock the counters and the associated flip-flops. When the first counter 123 reaches a terminal count, a pulse is outputted on the T/C line. This pulse is directed to the CEP input to the second counter 121 one clock time later due to the delay experienced in the flip-flop 124. The pulse on the T/C output of the second counter 121 is shown occurring after receipt of the pulse on the CEP input. For the conditions established by the circuitry, that T/C signal indicates the occurrence of a count corresponding to 16 preceding counts of 14 T/C counts from the first stage counter 123. On the receipt of the T/C signal from the second counter 121, the flip-flop 122 changes output state such that the signal on the Q/ output goes high, which signal as previously mentioned is directed to the PE/ inputs to both counters causing both counters to load the preset signals strapped to their inputs. In the case of counter 123 the hex value B is loaded into the counter and in the case of counter 121, a 0 value is loaded. After the loading, the counter 123 continues counting clock pulses, but commencing from the hex value of B(11). In this manner, every 16 count cycles and additional count of 9 is added to the count to make a total count of 233. The selection of these particular values is based on the desire to keep continuous track of cumulative errors that appear between the incoming digital signal and the reference signal. The way that this is achieved is to generate a square wave that is 1/233 of the 6XPCLK signal in frequency and to keep the leading and trailing edges of this signal aligned with the transitions of the incoming digital signal.

While there has been shown what is considered to be the preferred embodiment of the invention, it will be manifest that many changes and modifications may be made herein without departing from the spirit and scope of the invention. The scope of the invention, being limited only by the scope of the appended claims.

I claim:

1. A low jitter phase-locked loop comprising:
   an error detector for receiving an incoming digital signal and a reference signal and for providing SLOW DOWN or SPEED UP signals as a function of the deviation of the reference signal from said incoming digital signal;
   a power source;
   pulse driver means for receiving said SLOW DOWN and said SPEED UP signals at its input and for connecting said power source to its output as a function of the received signals;
   a low pass filter means coupled to the output of said drive means, including an integrator circuit having a capacitor and a variable resistor connected across said capacitor for controlling the discharge of the said capacitor so as to operate said filter in a lagging phase mode;
   a voltage controlled oscillator having an input connected to said low pass filter means for providing an output signal as a function of the signal on its input; and
   a divider means coupled to the output of said voltage controlled oscillator for dividing the signal from said voltage controlled oscillator thereby generating said reference signal.

2. The low jitter phase-locked loop according to claim 1 and further comprising:
   gated counter means for providing a pulse train signal as a function of the count of the output signal from said voltage controlled oscillator in response to an enabling signal.

3. The low jitter phase-locked loop according to claim 1 wherein said low pass filter means is further comprised of a gain adjusting means coupling the output of said driver means to the input of said voltage controlled oscillator.

4. The low jitter phase-locked loop according to claim 3 wherein said low pass filter means is adjusted to provide approximately a 200 ns lag in said reference signal.

5. A low jitter phase-locked loop according to claim 1 wherein said divider means is comprised of:
   a first and a second counter each having an input and a terminal count output;
   a first flip-flop connected between the terminal count output of said first counter and the input to said second counter; and
   a second flip-flop connected between the terminal count output of said second counter and the error detector for providing said reference signal.

6. A low jitter phase-locked loop according to claim 5 wherein said first counter is at 4-bit serial in parallel out counter strapped to an 11 count, and said second counter is a 4-bit serial in parallel out counter strapped to a 0 count and wherein the complemented outputs from said first flip-flop is directed to a first enabling input to said second counter and the non-complemented output of said first flip-flop is said reference signal and the complemented output is connected to a second enabling input of said first and said second counter, the first enabling input to said first counter being connected to a voltage level sufficient to provide continual enablement, with the clocking inputs to said first and said second counters and said first and said second flip-flops being connected to receive the output signal from said voltage controlled oscillator.

7. A low jitter phase-locked loop comprising:
   detector means for detecting the deviation of a digital reference signal from an incoming digital signal;
   a storage medium;
   means for pumping charges to said storage medium when the deviation detected by said detector means is in a first direction;
   means for controlling the discharging of said storage medium when the deviation detected by said detector means is in a second direction so as to operate said phase-locked loop in a lagging phase mode;
   on oscillator means responsive to the charge on said storage medium for providing an output signal as a function of the charge on said storage medium; and
   divider means for dividing the output signal from said oscillator means so as to provide said reference signal to said detector means.

8. The low jitter phase-locked loop according to claim 7 and further comprising:
   gated counter means for providing a pulse train signal as a function of the count of the output signal from said oscillator means in response to an enabling signal.

9. The low jitter phase-locked loop according to claim 7 and further comprising gain adjusting means coupled to the input to said oscillator means for controlling the gain of said oscillator means.

10. The low jitter phase-locked loop according to claim 7 wherein said divider means is comprised of counters for receiving the output signal from said oscillator means and for dividing said output signal by 233.

* * * * *

UNITED STATES PATENT AND TRADEMARK OFFICE
CERTIFICATE OF CORRECTION

PATENT NO. : 4,818,950

DATED : April 4, 1989

INVENTOR(S) : Michael H. Ranger

It is certified that error appears in the above-identified patent and that said Letters Patent is hereby corrected as shown below:

Column 8, line 38, delete "in a second" and substitute -- not in said first --.

Column 8, line 40, delete "on" and substitute --an--.

Signed and Sealed this

Third Day of October, 1989

Attest:

DONALD J. QUIGG

*Attesting Officer*  *Commissioner of Patents and Trademarks*